(12) United States Patent
Wu et al.

(10) Patent No.: US 8,650,020 B1
(45) Date of Patent: Feb. 11, 2014

(54) MODELING SECOND ORDER EFFECTS FOR SIMULATING TRANSISTOR BEHAVIOR

(75) Inventors: Shuxian Wu, San Jose, CA (US); Tao Yu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1027 days.

(21) Appl. No.: 12/363,592

(22) Filed: Jan. 30, 2009

(51) Int. Cl.
*G06F 17/50* (2006.01)

(52) U.S. Cl.
USPC .......................................................... 703/15

(58) Field of Classification Search
USPC ...................................... 703/13, 15
See application file for complete search history.

(56) References Cited

U.S. PATENT DOCUMENTS

| 7,542,891 B2 * | 6/2009 | Lin et al. ........................... | 703/14 |
| 2008/0127005 A1 * | 5/2008 | Lin et al. ........................... | 716/4 |

OTHER PUBLICATIONS

SYNOPSYS, HSPRICE User Guide: RF Analysis Version B-2008. 09 Sep. 2008.*

* cited by examiner

*Primary Examiner* — David Silver
(74) *Attorney, Agent, or Firm* — W. Eric Webostad; Gerald Chan; Lois D. Cartier (57) ABSTRACT

Modeling and simulating behavior of a transistor are described. At least one sub-circuit model for modeling at least one second order effect associated with the transistor is obtained. At least one instance parameter for the at least one second order effect is obtained. Operation of a transistor behavior simulator is augmented with the at least one sub-circuit model populated with the at least one instance parameter such that the simulating of the behavior of the transistor produces data that takes into account the at least one second order effect. The at least one second order effect may be an LOD/eSiGe effect, a poly pitch effect, or a DSL boundary effect. Also described is a method for generation of a sub-circuit model.

20 Claims, 10 Drawing Sheets

$$mulu0 = \sum_i weight(xi) * mulu0(xi)\_effect\_xi \quad \sim 901$$

$$mulvsat = \sum_i weight(xi) * mulvsat(xi)\_effect\_xi \quad \sim 902$$

$$dvth0 = \sum_i weight(xi) * dvth0(xi)\_effect\_xi \quad \sim 903$$

MODELING SECOND ORDER EFFECTS FOR SIMULATING TRANSISTOR BEHAVIOR

FIELD OF THE INVENTION

The invention relates to semiconductor integrated circuit devices ("ICs"). More particularly, the invention relates to modeling second order effects for simulating transistor behavior.

BACKGROUND OF THE INVENTION

The realm of semiconductor devices encompasses many types of integrated circuits. Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

As lithographies of advanced semiconductors, such as FPGAs, get smaller, on the order of 65 nm and smaller, second order or layout proximity effects have a greater impact on device behavior. Some of these second order effects, such as Length of Diffusion ("LOD") and Well Proximity Effect ("WPE") have been incorporated into compact models, which can be simulated using any SPICE simulators, such as HSPICE and SPECTRE for example. However, heretofore all commercially available compact models including SPICE models BISM4.6 and PSP, among others, have not provided modeling of some previously unidentified second order effects. Model accuracy is increasingly hindered by the lack of these previously unidentified second order effects.

SUMMARY OF THE INVENTION

One or more aspects generally relate to modeling second order effects for simulating transistor behavior.

One aspect relates generally to a method for simulating behavior of a transistor. At least one sub-circuit model for modeling at least one second order effect associated with the transistor is obtained. At least one instance parameter for the at least one second order effect is obtained. Operation of a transistor behavior simulator is augmented with the at least one sub-circuit model populated with the at least one instance parameter such that the simulating of the behavior of the transistor produces data that takes into account the at least one second order effect. The at least one second order effect may be an LOD/eSiGe effect, a poly pitch effect, or a DSL boundary effect.

Another aspect relates generally to a method for generation of a sub-circuit model. Information is obtained from test structures for modeling at least one of the following named second order effects of a group consisting of an LOD/eSiGe effect, a poly pitch effect, and a DSL boundary effect. The test structures include a reference test structure not having any of the named second order effects, and at least one second order effect test structure selected from a group consisting of a test structure having only the poly pitch effect of the named second order effects, a test structure having only the LOD/eSiGe effect of the named second order effects, and a test structure having only the poly pitch effect of the named second order effects. The information includes second order effect instance parameters for transistors associated with the test structures. The information obtained is converted to associations with SPICE model instance parameters of mulu0, mulvsat, and delvto. The conversion includes: obtaining fitting coefficients from fitting equations for fitting the SPICE model instance parameters with the second order effect instance parameters. The fitting equations include: mulu0(x)_effect_x=f(x, W, L)_u0, mulvsat(x)_effect_x=f(x, W, L)_vsat, and delvto(x)_effect_x=f(x, W, L)_vth0. The function f(x, W, L) may alternatively be expressed as: $f(x, W, L) = f(W)*f(L)*[A0+A1/x+A2/(x*x)]$, or $f(x, W, L) = f(W)*f(L)*[A0+A1*x+A2*(x*x)]$. The fitting coefficients of A0, A1, and A2 are for at least one second order effect model in the sub-circuit model. The variable x is a second order effect instance parameter of the second order effect instance parameters selected from wrxd, wrxs, slw1, slw2, sll1, sll2, p2pd, and p2ps. The functions f(W) and f(L) are extracted transistor width and transistor length size dependencies, respectively.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
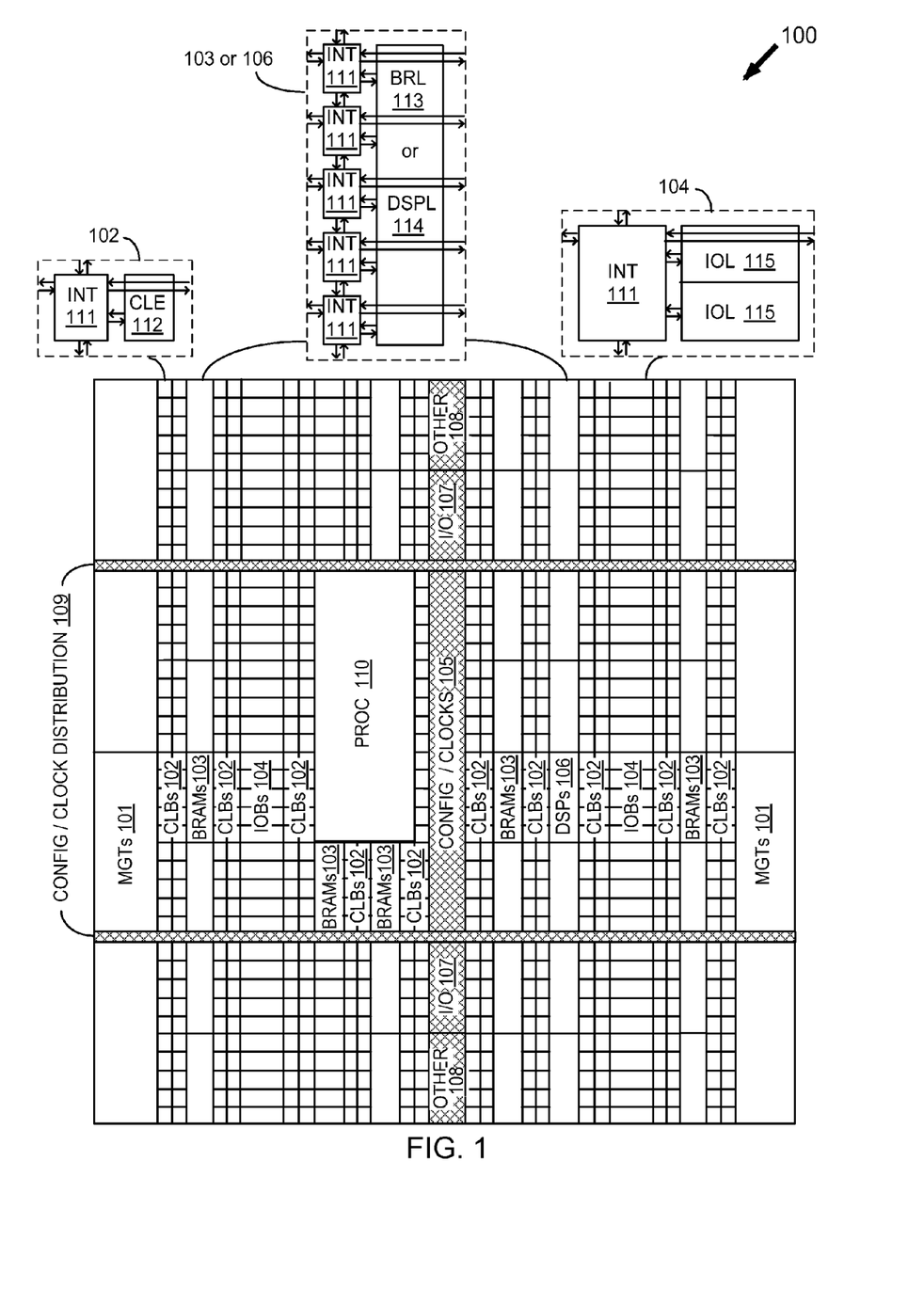
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
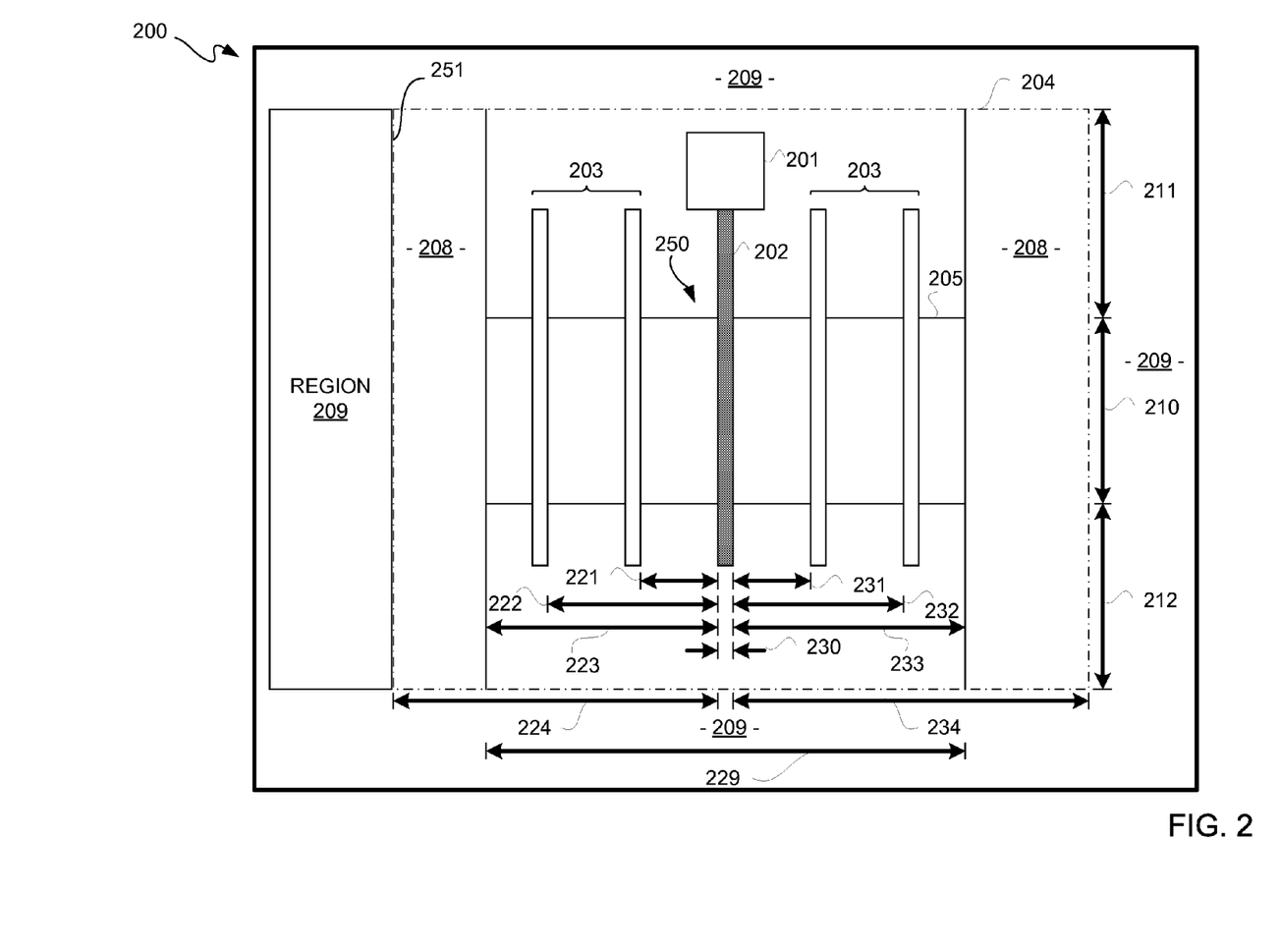
FIGS. 2 through 5 are top elevation views depicting respective exemplary embodiments of transistors of various portions of a semiconductor wafer 200.

FIG. 2 is a top elevation view depicting an exemplary embodiment of a portion of a semiconductor wafer 200 having a transistor 250. Semiconductor wafer 200 has formed therein a well 204. Within well 204 is formed an active region 205. Formed above active region 205 and extending above field region 208 are dummy "active" gates 203 and active gate 202. Active gate 202 is coupled to contact 201. A gate dielectric (not illustratively depicted) is located between active region 205 and active gate 202.

Top, bottom, left, and right boundary instance parameters with respect to source and drain side sidewalls of active gate 202, and widths of an active region from source and drain side sidewall of active gate 202 to respective source and drain side diffusion borders may be determined for an instance of a transistor 250. More particularly, left side stress length ("sll1") 224 is from a source side sidewall edge of active gate 202 to a well 204/DSL region 209 boundary, namely to the left border of well 204. Stress length ("sll2") 234 is from a drain side sidewall edge of active gate 202 to a well 204/DSL region 209 boundary, namely to the right border of well 204. Upper stress width ("slw1") 211 is from a top border of active region 205 to a top border of well 204, and lower stress width ("slw2") 212 is from a bottom border of active region 205 to a bottom border of well 204. A second order DSL boundary effect described below in additional detail may not apply to all sides of well 204, as described below in additional detail, and thus a subset of instance parameters 211, 212, 224, and 234 may be used in determining such second order effect.

A "poly" pitch effect described below in additional detail may be determined progressively from an active gate outwardly toward each nearest neighbor dummy gate on source and drain sides of such active gate of a transistor 250. Thus, for example from a source side sidewall of active gate 202 to a nearest sidewall of a first dummy gate 203 on such source side, a first order of an instance parameter "p2ps1" 221 is defined. Likewise, on a drain side sidewall of active gate 202 to a nearest sidewall of a nearest dummy gate 203 on such drain side a first order of an instance parameter "p2pd1" 231 is defined. A next higher order of such second order "poly" pitch effect may be determined for a next nearest dummy gate with respect to active gate 202. Thus, from the source side sidewall of active gate 202 to a nearest sidewall of a second closest dummy active gate 203 on such source side may be defined an instance parameter "p2ps2" 222, and on a drain side sidewall of active gate 202 to a nearest sidewall of a second closest dummy active gate 203 on such drain side may be defined an instance parameter p2pd2 232. Even though not shown for purposes of clarity and not limitation, higher order effects of such second order "poly" pitch effect may be determined, which may be generally indicated with the previously nomenclature as p2ps3, p2pd3, p2ps4, p2pd4, etc. Other parameters for transistor 250 are a width ("W") 210 and a length ("L") 230, as is known.

Active region 205 may be formed in wafer 204 by adding another material to wafer 200. For example, wafer 200 may be a silicon ("Si") wafer and active region 205 may be formed at least in part using epitaxial growth of germanium ("Ge") to form a silicon-germanium active region 205. This type of active region 205 is known as an embedded silicon-germanium ("eSiGe") diffusion region, and is generally used only for PMOS devices. Alternatively, active region 205 may be formed by one or more implants or diffusions, or a combination thereof without embedded silicon-germanium.

Adjacent to well 204 may be another well. Even though region 209 is shown only adjacent to a left side of well 204, it should be appreciated that regions 209 may completely or partially surround well 204. Therefore, regions 209 may be on any or all of the right, left, top, or bottom sides of well 204.

For an LOD second order effect, enhancement or reduction in carrier mobility in active region 205, or more particularly in the channel region (below active gate 202) of active region 205 may be due in part to stress caused by bordering an isolation region, such as a shallow trench isolation ("STI") region. In this embodiment, an STI region is generally indicated as field region 208. It should be understood that well 204 may not extend to region 209 when effectively blocked by field/isolation region ("STI region") 208. The closer a transistor, generally indicated as transistor 250, is located to region 208, the more likely carrier mobility is impacted due to stress caused by such STI. A single transistor 250 is generally indicated for purposes of clarity and not limitation; however, it should be understood that multiple transistors may be modeled as described herein.

However, for a device in which an eSiGe region may be used, the larger lattice of germanium, as compared with silicon, in a confined etched out trench in which an eSiGe layer is grown to provide an active region introduces additional stresses which have a combined effect with LOD stress. This newly identified combined second order effect is herein termed an "LOD/eSiGe" second order effect, and such LOD/eSiGe second order effect heretofore was not a modeled second order effect. While the embodiment described is for eSiGe for purposes of clarity by way of example and not limitation, it should be appreciated that any material having a larger or smaller lattice structure than the material used to form wafer 200 may impose additional parasitic stresses, and thus it should be understood that the scope of this description is not limited to eSiGe, but more generally includes any material having a larger or smaller lattice structure than the material of a base substrate or wafer.

Epitaxial SiGe growth in source and drain regions of transistor 250 enhances PMOS performance and at the same time brings additional geometry effects to such transistor due to shape control, recess depth, volume, and other parameters of such epitaxial SiGe. Thus, dependency of an LOD/eSiGe second order effect may generally be said to depend upon width ("W") 210 and length ("L") 230 of a transistor 250, an instance parameter for source side diffusion of active region 205 ("wrxs") 223, an instance parameter for drain side diffusion of active region 205 ("wrxd") 233, and eSiGe volume and shape.

Additionally, if another gate or gates is sufficiently close to active gate 202 on a source side of transistor 250 (assumed to be the left side for purposes of clarity and not limitation), an LOD/eSiGe second order effect may further generally be said to additionally depend upon source side spacing between active gate 202 and a source side nearest neighbor gate 203, previously described as instance parameter "p2ps1" 221. For more than one dummy gate on a source side proximate to active gate 202, higher order p2ps effects may be included for additional accuracy. Moreover, if another gate or gates is sufficiently close to active gate 202 on a drain side of transistor 250 (assumed to be the right side for purposes of clarity and not limitation), an LOD/eSiGe second order effect may yet further generally be said to additionally depend upon spacing between active gate 202 and a drain side nearest neighbor gate 203, previously described as instance parameter "p2pd1" 231. For more than one dummy gate on a drain side proximate to active gate 202, higher order p2pd effects may be included for additional accuracy.

Generally, the existence of one or more dummy gates affects LOD/eSiGe second order effects, as the presence of one or more dummy gates may block a portion of second order effects due to LOD/eSiGe stresses. Again, the closer an active gate 202 is to boundary 251, performance degradation due to LOD/eSiGe second order effects may be greater.

Even though instance parameters wrxs 223 and wrxd 233, as well as instance parameters p2ps and p2pd, were generally described with respect to a poly pitch effect, use of such instance parameters may take into account presence or absence of STI 208/well 204 boundaries. For example, instance parameter wrxs 223 may only be considered if an STI 208/well 204 boundary were at the left edge of well 204, and likewise instance parameter wrxd 233 may only be considered if an STI 208/well 204 boundary were at the right edge of well 204. Moreover, instance parameter p2ps1 221 may only be considered if an STI 208/well 204 boundary were at the left edge of well 204, and likewise p2pd1 231 may only be considered if an STI 208/well 204 boundary were at the right edge of well 204.

Another second order effect heretofore not accounted for in compact models is due to adjacent stresses from bordering dual stress liners ("DSLs"), and is termed herein a "DSL boundary effect." As is known, carrier mobility may be enhanced by imposing stress on active region 205. Conventionally, this may include a modulated deposition of a dielectric layer above or over active region 205. For an NMOS device, well 204 is a p-well, and the type of force imposed by a dielectric layer of a DSL for an NMOS device on active region 205 is a tensile stress. In contrast, for a PMOS device, namely where well 204 is an n-well, a DSL dielectric layer is deposited to provide a compressive force on active region 205. Thus it should be understood that different types of DSLs exist, where tensile force is used for NMOS devices and compressive force is used for PMOS devices.

If region 209 were for an NMOS device, namely a p-well 209, and well 204 were for an PMOS device, namely an n-well 204, then an NMOS device associated with p-well 209 borders at least on one side of n-well 204 for PMOS devices. Again, it should be understood that region 209 is generally used to indicate any or all top, bottom, left, or right side bordering region of well 204. So, if an n-well 204 were formed in the middle of a p-well or p-type region for example, such n-well 204 could be surrounded by one or more p-type regions 209.

If well 204 was a p-well for an NMOS device having a tensile force DSL, and region 209 was for a PMOS device having a compressive force DSL, the tensile/compressive boundary effect would apply as where the bordering compressive force would negatively impact the carrier mobility of the NMOS device associated with p-well 204. A compressive force on an active region of a NMOS device generally tends to reduce carrier mobility thereof. Thus, such parasitic compressive force from a bordering compressive DSL can have a negative effect on carrier mobility of an NMOS device for transistor 250. A transistors 250 closer to a tensile/compressive boundary 251 may be more greatly affected than those further from such boundary.

Likewise, if well 204 was an n-well for a PMOS device, and region 209 was for a NMOS device having a tensile force DSL, the tensile/compressive boundary effect would apply, as where the bordering tensile force would negatively impact the carrier mobility of the PMOS device associated with n-well 204. A tensile force on an active region of a PMOS device generally tends to reduce carrier mobility thereof.

Thus, such parasitic tensile force from a bordering tensile DSL can have a negative effect on carrier mobility of a PMOS device for transistor 250. Transistors 250 closer to a tensile/compressive boundary 251 may be more greatly affected than those further from such boundary.

It should be understood that regions partially or completely adjacent to well 204 may include one or more isolation regions, one or more compressive DSLs, or one or more tensile DSLs, or a combination thereof. Thus, for modeling purposes, one or both DSL boundary and LOD/eSiGe second order effects may present.

To recapitulate DSL boundary effects, a tensile film such as for NMOS interacts with a compressive film such as for PMOS. Furthermore, a compressive film for PMOS interacts with a tensile film for NMOS. In some instances, DSL boundary effects are combined with WPEs if a DSL boundary is defined by a well boundary.

Orientation of active region 205 with respect to a boundary of well 204 has an impact on DSL boundary effects. Thus, DSL boundary effects may be classified as transverse or lateral. In other words, a DSL boundary effect from a lateral gate direction may be termed a lateral boundary effect, which varies with sll1 224 and sll2 234. Because a DSL boundary is conventionally defined by a well boundary, either or both transverse and lateral boundary effect parameters may be used for a WPE in a sub-circuit model, described below in additional detail.

In this embodiment, length 229 of active region 205 is generally parallel with top and bottom borders of well 204, thus transverse DSL boundary effects may generally be said to depend upon transistor width 210, and the previously described instance parameters of "upper stress width" ("slw1") 211 and "lower stress width" ("slw2") 212, as well as DSL stress level and an eSiGe (if present) for active region 205. DSL boundary effects may add further to WPE, namely further degrading NMOS drain currents. Transverse boundary effects, however, may enhance PMOS mobility and PMOS drain current. Transverse DSL boundary effects may be more susceptible to narrow devices, especially those close to a DSL boundary.

Lateral DSL boundary effects are where a tensile NMOS film interacts with a compressive PMOS film and a compressive PMOS film interacts with a tensile NMOS film. In this embodiment, width 210 of active region 205 is generally parallel with left and right borders of well 204 and regions 209, thus lateral DSL boundary effects may generally be said to depend upon transistor length 230, and the previously described instance parameters of source side stress length ("sll1") 224, drain side stress length ("sll2") 234, and any proximate p2ps1 221 or p2pd1 231 and higher orders, as well as DSL stress level and an eSiGe (if present) for active region 205. Lateral DSL boundary effects affect both PMOS and NMOS devices. However, only devices closer to the border of compressive and tensile films may be affected.

It should be understood that a tensile/compressive DSL boundary may be on a subset of the sides of well 204 or on all sides of well 204. Thus, even though transverse and transverse DSL boundary effects instance parameters were generally described, use of such instance parameters may take into account presents or absence of tensile/compressive boundaries. For example, instance parameter slw1 211 may only be considered if a tensile/compressive boundary were at the top edge of well 204, and likewise instance parameter slw2 212 may only be considered if a tensile/compressive boundary were at the bottom edge of well 204. Moreover, instance parameter sll1 224 may only be considered if a tensile/compressive boundary were at the left edge of well 204, and likewise sll2 234 may only be considered if a tensile/compressive boundary were at the right edge of well 204.

A dielectric layer, such as for a DSL, a Stress Memorization Technique ("SMT"), an inter-dielectric layer ("ILD"), or a edge stop layer ("ESL"), deposited at least in part between gates, such as active gate 202 and an adjacent dummy "active" gate 203, or between dummy active gates 203, or more generally between stripes 202 and 203, imposes stresses between and on such gates. The distance between gates and having a dielectric layer therebetween creates another second order effect, referred to herein as the "poly" pitch effect. For purposes of clarity by way of example and not limitation, it is assumed that gates 202 and 203 are formed of doped polycrystalline silicon ("poly"); however, gates 202 and 203 may be formed of metal or another type of conductor.

The "poly pitch effect" may be less significant for NMOS than for PMOS. PMOS devices may further suffer from a second order poly pitch effect due to presence of an eSiGe for active region 205. Stress may degrade PMOS carrier mobility, especially of transistors having gates with narrow spacing between them.

Poly pitch effects may generally be said to be dependent upon transistor width 210 and length 230, as well as presence of eSiGe. Furthermore, there is a dependence on semiconductor wafer processing such as whether a DSL is included, and the thickness and strength, among other characteristics of such liner as well as the recess depth used to form such eSiGe and the overall volume of such eSiGe, as well as other eSiGe physical parameters. As previously mentioned, at least two instance parameters may be used to model poly pitch effects, namely p2ps and p2pd.

While the poly pitch effect exists for minimum pitched gates, a non-minimum pitch or spacing of gates also has a poly pitch effect for PMOS devices. Moreover, for non-minimum pitch of gates, variations from process changes may increase. Accordingly, for p2p spacing for PMOS devices that have little ability to very within an IC circuit design, a 0.4 micron maximum pitch for 40 and 45 nanometer lithographies may be used to reduce uncertainty.

To recapitulate, there are three second order effects for which modeling is described herein which were previously unaccounted for in transistor modeling, these second order effects are a combined LOD/eSiGe effect, a DSL boundary effect, and a poly pitch effect. The poly pitch effect is to account for spacing larger than minimum pitch. Thus, transistors formed using an advanced lithographic technology, such as equal to or less than 65 nanometer lithography and more particularly less than a 45 nanometer lithography, having DSLs and eSiGe regions in a CMOS device with STI may have all three of these second order effects. Again, for purposes of clarity, region 209 has been generalized, however it should be appreciated that region 209 may be a PMOS region or an NMOS region, and well 204 may be for a PMOS device or an NMOS device.

As previously described, the combined LOD/eSiGe second order effect model uses a source side width instance parameter ("wrxs") 223 and a drain side width instance parameter ("wrxd") 233. Instance parameters 223 and 233 respectively are effectively source side and drain side diffusion lengths of an active region 205. By "multi-finger transistor," it is meant generally a transistor having an active gate and at least one other generally parallel gate. A gate finger space ("sd"), which may be spacing 221 or 231 for example, is may be a gate finger space instance parameter.

Even though a rectangular region is shown for active region 205, it should be understood that less regularly shaped layouts may be used. For example, in FIG. 3 there is shown more irregularly shaped layout for an active region 205 of a transistor 300 of a portion of wafer 200. Active region 205 does not have a substantially uniform width W 210 across its entire length. Width 210 of active region 205 may be described as the sum of Y1 and Y2, where width Y1 210-1 is for most of the length of active region 205 and width Y2 210-2 for all of the length of active region 205, including a left most portion where width Y1 210-1 is not a parameter. Instance parameter wrxs may be parsed out for different widths of active region 205 as wrxs1 223-1, namely from a source side sidewall of active gate 202 to a nearest left border of active region 205, and wrxs2 223-2, namely from a source side sidewall of active gate 202 to a leftmost border of active region 205.

Figure 3:
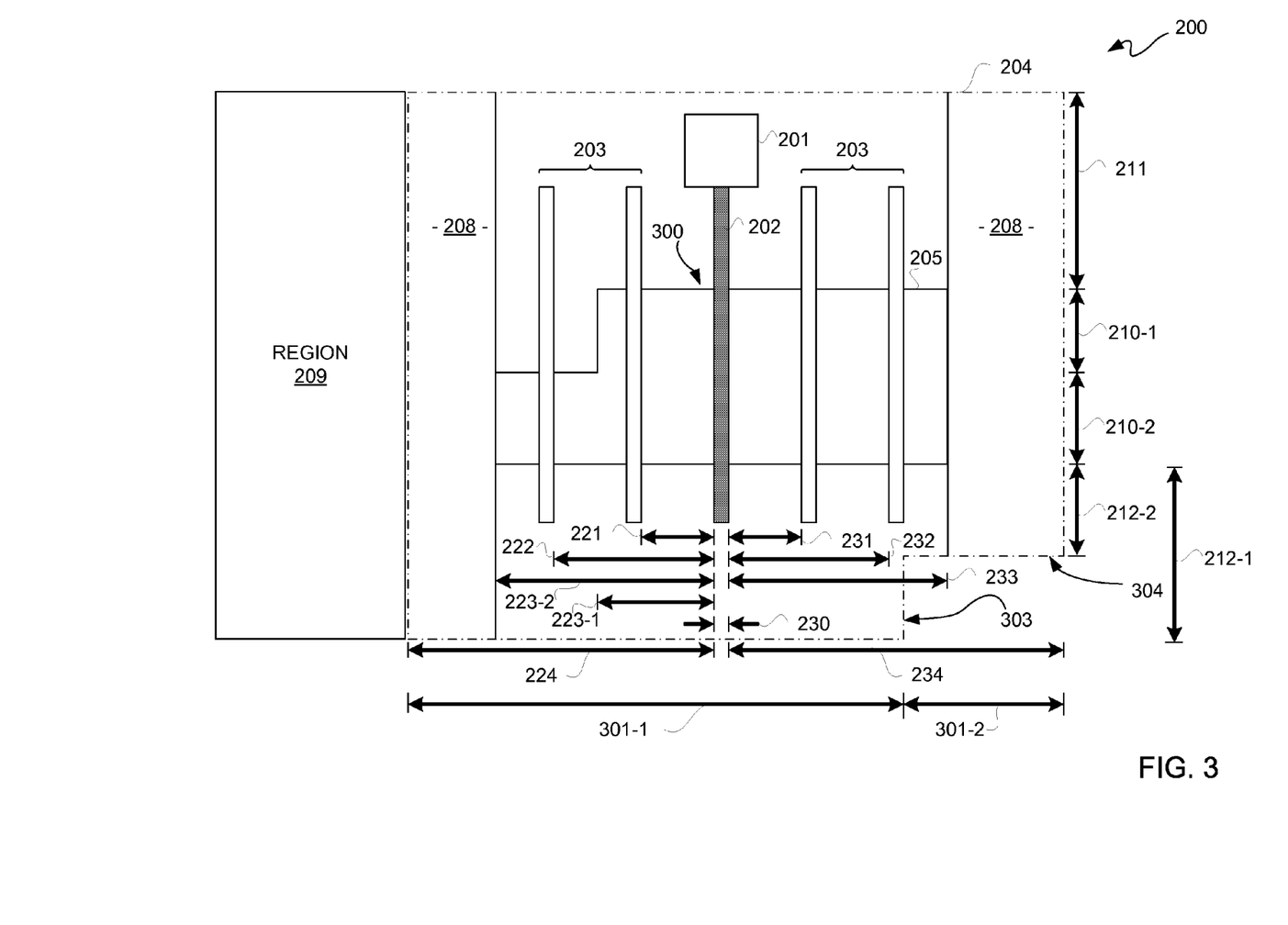

Furthermore, in the embodiment illustratively depicted in FIG. 3, a well 204 has an irregularly shaped layout. In this embodiment, a length X2 301-2 extends from a rightmost border of well 204 to a border 303 of well 204 located between a rightmost and a leftmost border thereof. From border 303 to a leftmost border of well 204 is length X1 301-1. Instance parameters X1 and X2 thus divide a bottom DSL boundary experienced by transistor 300.

For such an irregular shape, an effective instance parameter for each of the above-mentioned second order effects may be determined generally by geometric averaging of each segment. For example, instance parameter slw2 for FIG. 3 may be set equal to slw2_1*X1/(X1+X2)+slw2_2*X2/(X1+X2), where slw2_1 is width 212-1, which is the same as width 212 of FIG. 2, and slw2_2 is width 212-2, namely from a bottom border of active region 205 to border 304 of well 204, where border 304 is located between a top most and bottom most borders of well 204.

In a multi-finger embodiment, sll1 to a first finger is the distance from the right side of DSL boundary 251 to a first finger, namely a left most dummy active gate 203, of a multi-finger transistor. In a multi-finger transistor layout, instance parameter sll1 224 may be set equal to length sll1 to a first finger+(nx−1)*(L+sd)/2, where L is a gate channel length, sd is a gate finger space, and nx is a multi-transistor finger number. A DSL boundary second order effect from a vertical gate direction may be termed a transverse boundary effect which varies with slw1 211 and slw2 212.

Accordingly, it should be appreciated that using some polygon or other geometric averaging, instance parameters may be adjusted for purposes of modeling. However, for purposes of clarity by way of example and not limitation, it shall be assumed that the more regularly shaped layout for active region 205 and well 204 are used.

Figure 4:
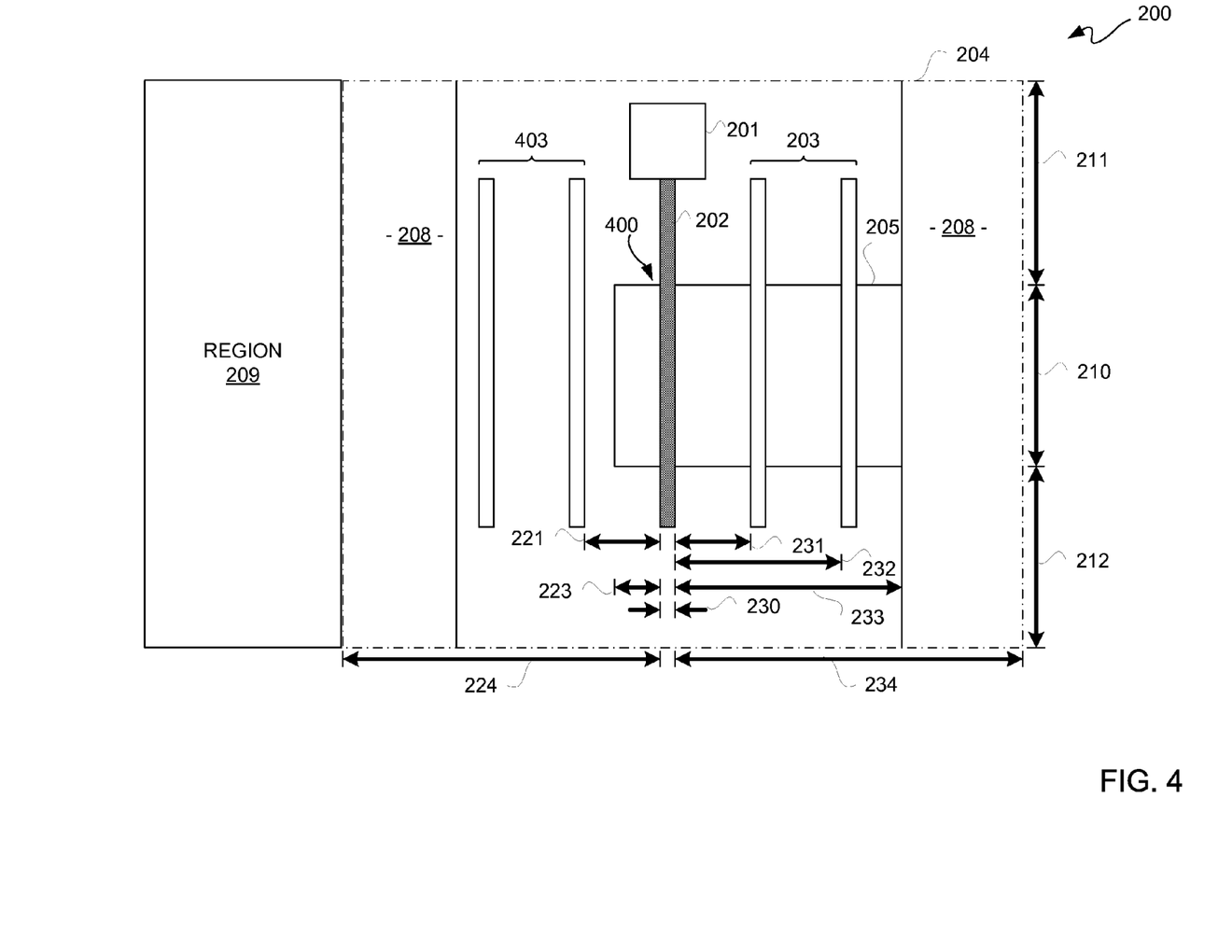

FIG. 4 is a top elevation view depicting an exemplary embodiment of a portion of a wafer 200 having a transistor 400. In wafer 400, dummy gates 403 on a source side are dummy field gates as they do not extend directly above or over active region 205. Assuming active region 205 is an eSiGe region and regions 208 are STI regions, a LOD/eSiGe second order effect is interacted by a poly pitch effect. However, the nearest dummy gate on a source side is a dummy field gate 403, and thus a switch in a model may be set to recognize proximity of dummy active gates and dummy field gates with respect to active region 205, namely to switch between such different types of dummy gates.

Figure 5:
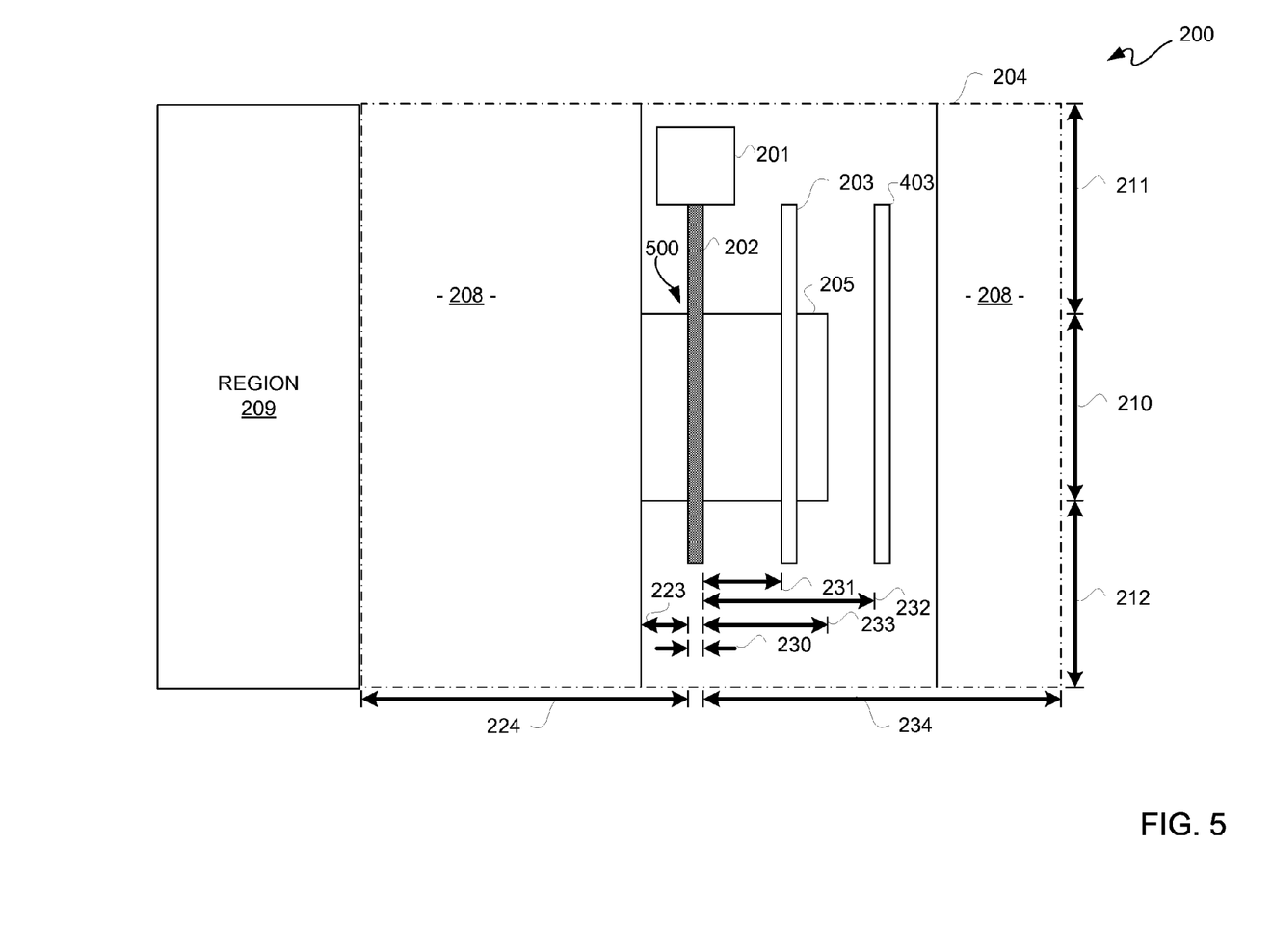

FIG. 5 is a top elevation view depicting an exemplary embodiment of a portion of a wafer 200 having a transistor 500. In FIG. 5, there is a dummy active gate 203 on a drain side and a dummy field gate 403 to the right of such dummy active gate 203 on the drain side. However, there are no dummy gates on the source side. Accordingly, transistor 500 of wafer 200 may be used in instances where a nearest dummy field gate is far away from active region 205 to demonstrate a strong current degradation.

It should be understood that wrxs 223 in FIGS. 4 and 5 and wrxd 233 in FIGS. 4 and 5 may vary according to a diffusion region of active region 205. For example, in FIG. 4, active region 205 does not extend to a nearest neighbor dummy field gate 403 on a source side of transistor 400. Furthermore, p2ps 221 as between a nearest neighbor source side dummy field gate 403 and active gate 202, and p2pd 231 may be taken into account as illustratively depicted in FIG. 4. However, there may not be any p2p second order effect as between a next nearest neighbor dummy field gate 403 and active gate 202 on the source side. Furthermore, there is no p2ps for transistor 500 of wafer 200. Thus, whether dummy field gates, dummy "active" gates, or active gates from nearby transistors, all such poly pitch instance parameters (p2ps1, p2pd1, p2ps2, p2pd2 . . . ; generally up to but not exceeding third orders for sufficient accuracy) may be extracted by CAD tools modified to do so. All these poly pitch instance parameters may then be fed into one or more models. When poly to poly spacing is greater than some number (for example, approximately 1.8 μm or greater in 40 to 45 nm lithography), the poly pitch effect is either so attenuated or non-existent so as not to matter. Moreover, a nearest neighbor or "first" dummy field poly, dummy "active" gate or "active" gate from a nearby transistor is more dominating in the poly pitch effect, and thus in some instances only first order poly pitch effects may be taken into account.

Accordingly, it should be understood that a poly pitch effect is from a drain/source side from an active gate to a first dummy gate, whether the dummy gate is a dummy active gate or a dummy field gate or an "active" gate from a nearby transistors. However, higher order parameters may be defined to model effective drain/source side active gate to second, third, fourth, etc. dummy active gates or dummy field gates for more accuracy.

A sub-circuit model for each second order effect, namely for a DSL boundary effect, a LOD/eSiGe effect, and a poly pitch effect may be generated. Such generation may involve measured data from test structures created in silicon in order to characterize such second order effects, as described below in additional detail. However, assuming such sub-circuit models have already been generated, flows 600 and 700 respectively of FIGS. 6 and 7 indicate how such sub-circuit models may be applied in order to enhance the accuracy of a conventional transistor model.

Figure 6:
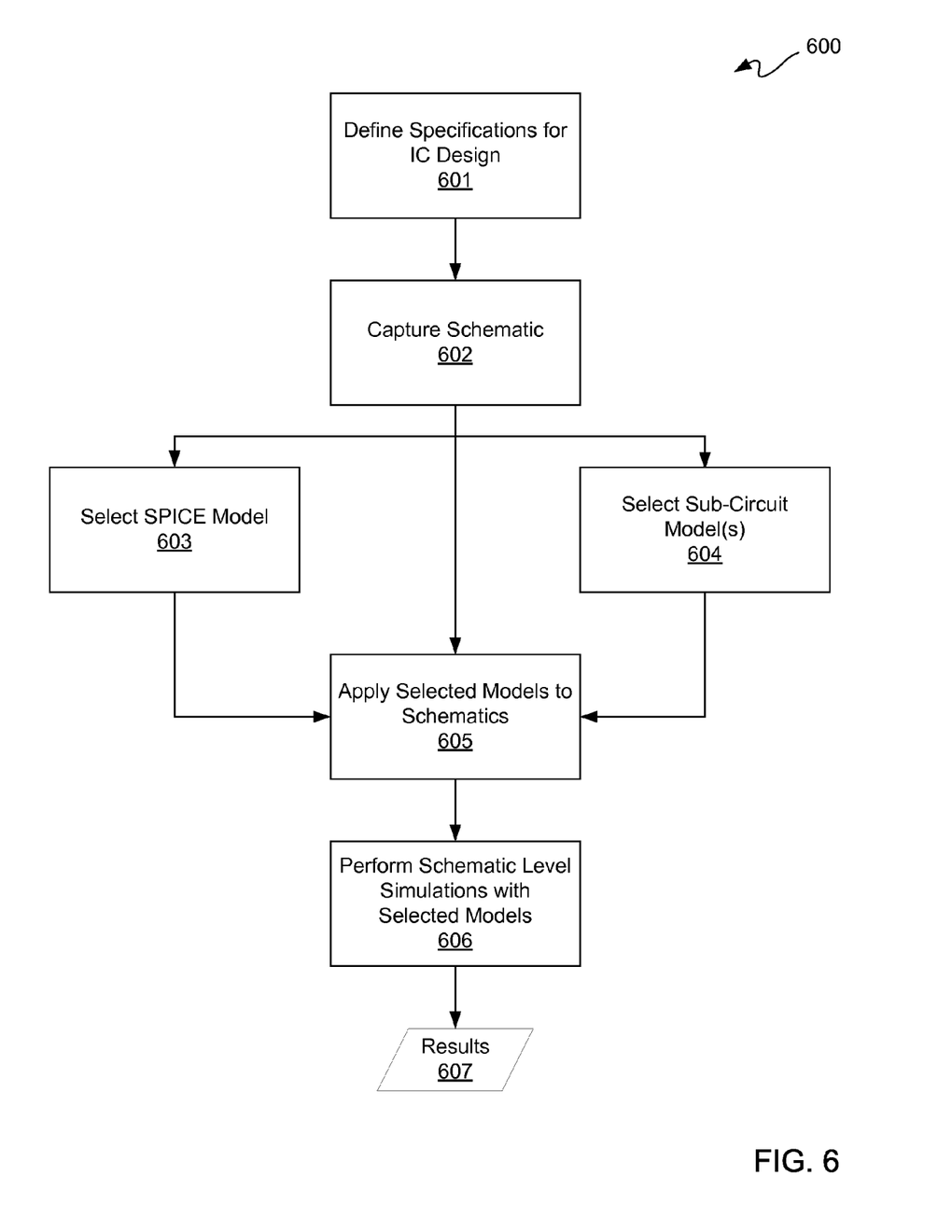
FIG. 6 is a flow diagram depicting an exemplary embodiment of a schematic level simulation flow.

FIG. 6 is a flow diagram depicting an exemplary embodiment of a schematic level simulation flow 600. At 601, specifications for an integrated circuit design are defined. At 602, schematics for the design defined at 601 may be obtained. Such schematics may be modeled using a conventional selected transistor model at 603, for example a compact SPICE model.

Sub-circuit models may be selected at 604 responsive to such captured schematics. At 605, the captured schematics may have applied thereto the selected models from 603 and 604. At 606, schematic level simulations with the selected models obtained at 603 and 604 may be performed to generate results 607. Thus, one or more of the three identified second order effects may be included in the simulations performed at 606 in order to obtain more accurate results 607 than those that would have been obtained with only using a conventional transistor model selected at 603.

Figure 7:
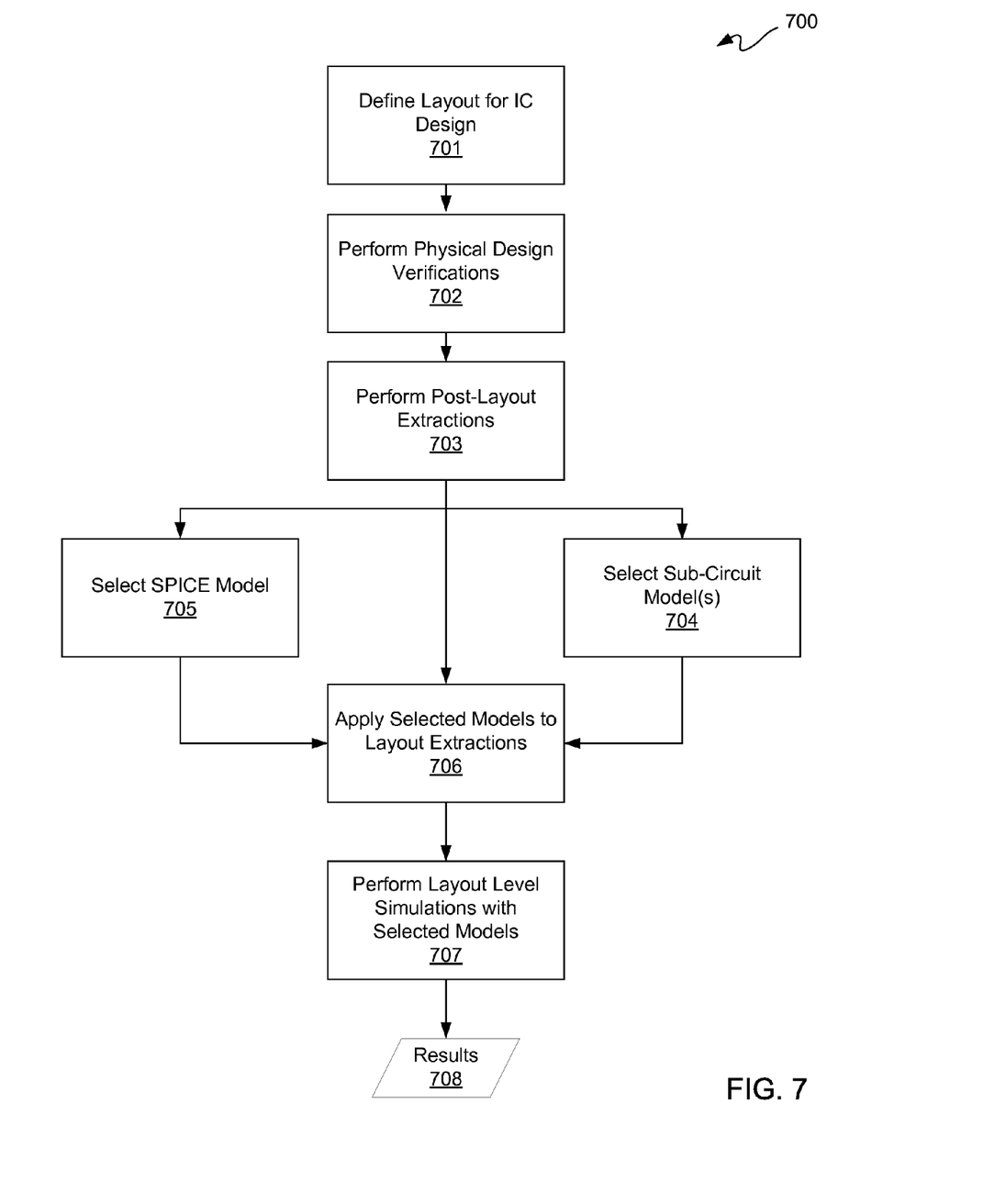
FIG. 7 is a flow diagram depicting an exemplary embodiment of a post-layout extracted simulation flow.

FIG. 7 is a flow diagram depicting an exemplary embodiment of a post-layout extracted simulation flow 700. At 701, a layout for an IC design is defined. At 702, physical design verifications are performed. Such verifications are sometimes referred to as layout versus schematic ("LVS").

At 703, post-layout extractions are performed. After layout of a device, physical parameters associated with such layout may be obtained at 703. At 705, a conventional transistor model, such as a compact SPICE model, is selected or invoked for modeling using the defined physical layout as identified from physical parameters extracted at 703.

At 704, using such physical parameters extracted at 703, one or more sub-circuit models for modeling one or more of the above identified three second order effects may be populated. Accordingly, one or more sub-circuit models may be selected at 704 for use with a transistor model selected at 705.

At 706, the models selected at 704 and 705 may be applied to the layout extractions obtained at 703. At 707, post-layout level simulations with the models selected 704 and 705 may be performed in order to generate simulation results 708. Such simulation results are enhanced in accuracy as compared with just using a convention transistor model due to the ability to have prediction of second order effects by invoking one or more sub-circuit models obtained at 704.

Figure 8:
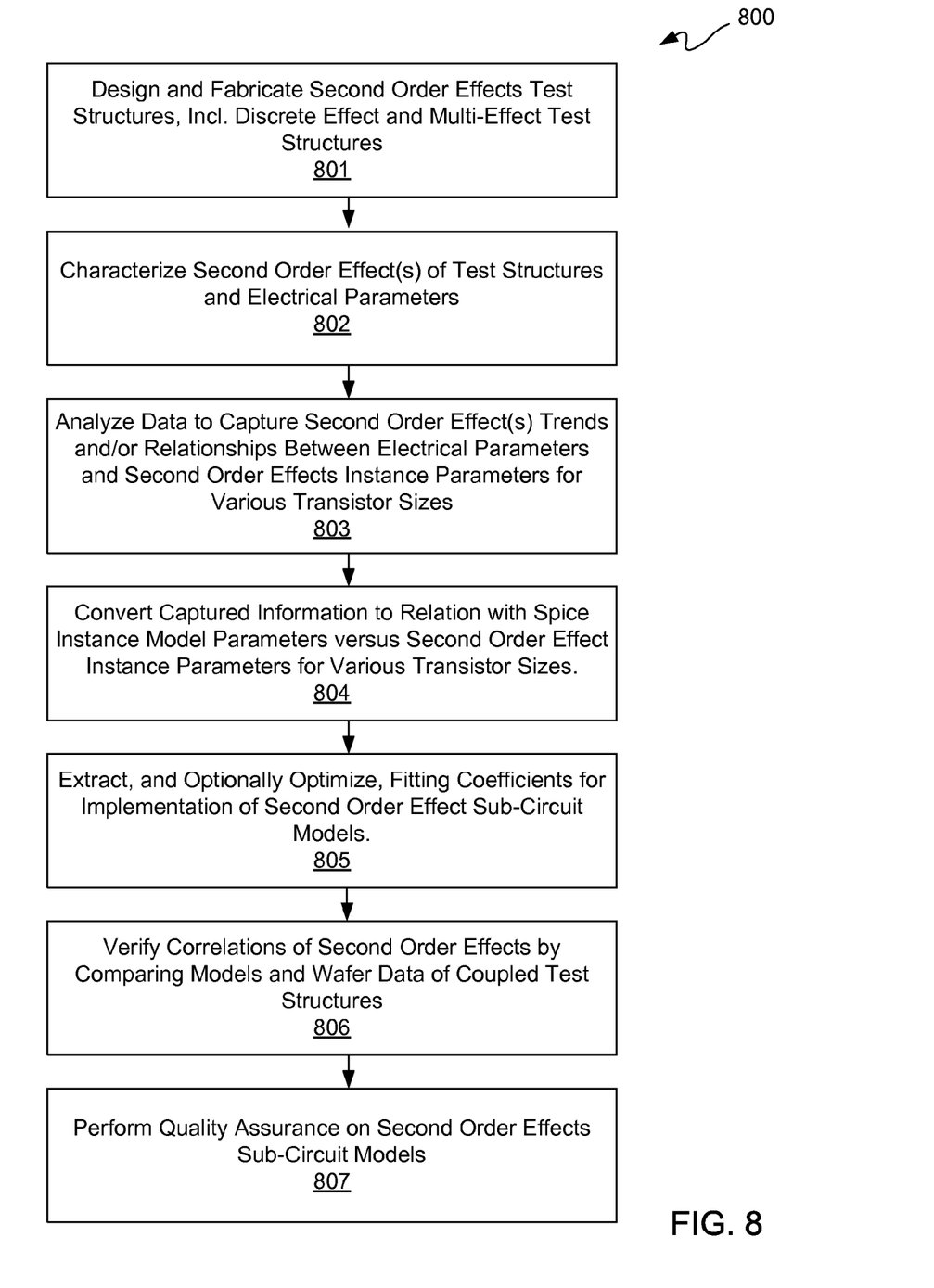
FIG. 8 is a flow diagram depicting an exemplary embodiment of a second order effects sub-circuit model extraction flow.

FIG. 8 is a flow diagram depicting an exemplary embodiment of a sub-circuit model extraction flow 800. A sub-circuit model for each second order effect described herein may be extracted from wafer data using a series of test structures. Such test structures may be formed on wafer 200, as previously described.

At 801, test structures are designed and taped out. Such test structures are for obtaining data associated with the three second order effects described herein, namely a DSL boundary effect, an LOD/eSiGe effect, and a poly pitch effect. Such test structures include discrete test structures, namely those that are solely for a single second order effect, and non-discrete test structures, namely those that couple more than one second order effect described herein, and may include all three second order effects described herein. For each of the effects or combinations thereof, a series of test structures may be designed by varying layout instance parameters. Layout instance parameters were previously described with reference to FIGS. 2 through 5. Such instance parameters may be varied for different transistor widths W and lengths L. For purposes of comparison, a reference structure without any second order effect described herein is also included as a test structure.

At 802, second order effects of such test structures are characterized along with electrical parameters. Characterization of second order test structures may be performed using a software tool, such as Etest or Bench IV measurements available from Xilinx of San Jose, Calif. Electrical parameters may include drain current for a linear region and drain current for a saturation region, such as for an IV curve of a transistor. Furthermore, electrical parameters may include threshold voltage for both saturation and linear regions of an IV curve of a transistor. Data analysis of electrical parameters sufficient to capture any trending effects may be used.

At 803, captured second order effects' trends and/or relationships between electrical parameters and second order effects data is analyzed for instance parameters of various transistors sizes. Each effect may be captured with different W and L dependence, as well as each second order effect instance parameter dependence for transistor W and L. The captured relations of electrical parameters versus second order effects instance parameters for different W/L values may be plotted to identify a curve either with a measured value or a relative change to the reference transistor structure. Percentage change for drive current and shifting of threshold voltages may be used.

At 804, captured information, such as trends and/or other relationships, is converted to relationships of SPICE model instance parameters as identified in equations 1 through 3 below. More particularly, relationships of second order effect instance parameters described herein with reference to FIGS. 2 through 5 for different transistor Ws and Ls are related to a low field effect carrier mobility multiplier ("mulu0"), a saturation velocity multiplier ("mulvsat"), and a delta or change in threshold voltage for a low field ("delvto").

Figure 9:
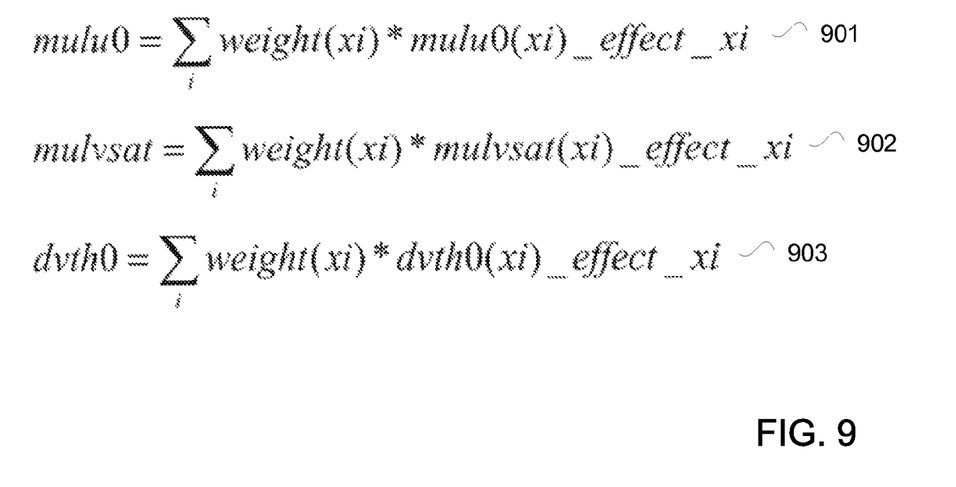
FIG. 9 is a listing depicting exemplary embodiments of equations that may be used in the flow of FIG. 8.

The variable x in equations 901 through 903 of FIG. 9 may be modified for adjusting behavior of a model, such that the model behaves more accurately to account for second order effects. Thus "effect xi" in each of equations 901 through 903 of FIG. 9 represents each component of second order effects for LOD/eSiGe, DSL boundary, and poly pitch effects.

At 805, fitting coefficients may be extracted and optionally optimized, for implementation of second order effect sub-circuit models. By choosing for example an optimized fitting equation, model coefficients may be extracted. There may be multiple iterations, i, and optimizations to obtain a reasonably good fit between simulations and measurements. There are known fitting equations for various SPICE model instance parameters for various transistors Ws and Ls, which may be used. Accordingly, these fitting equations may be used as a starting point for describing model instance parameters of a SPICE model versus second order effect instance parameters described herein with reference to FIGS. 2 through 5, for various W and L transistor sizes.

After balancing accuracy, complexity, and simulation time, a second order polynomial function may be selected at 805. While equations 901 through 903 indicate weighted sums for a number of i iterations, it should be understood that fitting equations for each model instance parameter may be more generally described as Equations 1 through 3, as follows:

$$mulu0(x)\_effect\_x = f(x,W,L)\_u0; \quad (1)$$

$$mulvsat(x)\_effect\_x = f(x,W,L)\_vsat; \text{ and} \quad (2)$$

$$delvto(x)\_effect\_x = f(x,W,L)\_vth0. \quad (3)$$

In equations 1 through 3, the function f(x, W, L) may alternatively be expressed as follows:

$$f(x,W,L) = f(W)*f(L)*[A0+A1/x+A2/(x*x)]; \text{ or} \quad (4)$$

$$f(x,W,L) = f(W)*f(L)*[A0+A1*x+A2*(x*x)]. \quad (5)$$

In Equations 4 and 5, A0, A1, and A2 are fitting coefficients for each second order effect model or models in a sub-circuit. The variable x is a second order effect instance parameter selected from wrxd, wrxs, slw1, slw2, sll1, sll2, p2pd, p2ps, where p2ps and p2pd may be of first and higher orders. The functions f(W) and f(L) are the extracted W and L transistor size dependencies, respectively. Separate fitting coefficients are associated with the functions f(W) and f(L). Even though for purposes of clarity, flow 800 is described as a continuous flow for processing multiple second order effects, it should be understood that operations 802 through 805 may be iteratively repeated to extract a model for each type of second order effect as generally indicated by Equations 901 through 903 and 1 through 3 for a second order effect x.

At 806, correlations of second order effects are verified by comparing the sub-circuit models with actual wafer data obtained from test structures. Thus, interactions between different second order effects may be verified. For example, a combined LOD/eSiGe effect may be interacted by a poly pitch effect. Operations 802 through 805 may be used to try to isolate or otherwise decouple and model each second order effect separately. However, at operation 806, interactions among all second order effects may be verified using actual test structure data obtained from the multiple effect or non-discrete second order effect test structures of 801.

Optionally, because of the complexity of stress mechanisms as well as model complexity, effect components may be weighted, namely collectively added up, and translated to a SPICE model instance parameter, namely a weighted average as generally indicated by equations 901 through 903.

At 807, quality assurance on second order effects sub-circuit models may optionally be performed. It should be understood that there are various types of transistor behavior simulations. Accordingly, second order effects sub-circuit models identified at 805 and verified at 806 against wafer data may be compared with each simulation, such as from HSPICE, SPECTRE, or other transistor behavior simulators. Simulations for each second order effect may be shown to match actual wafer data obtained from test structures in order to demonstrate such sub-circuit models are properly integrated within a transistor behavior simulator.

Figure 10:
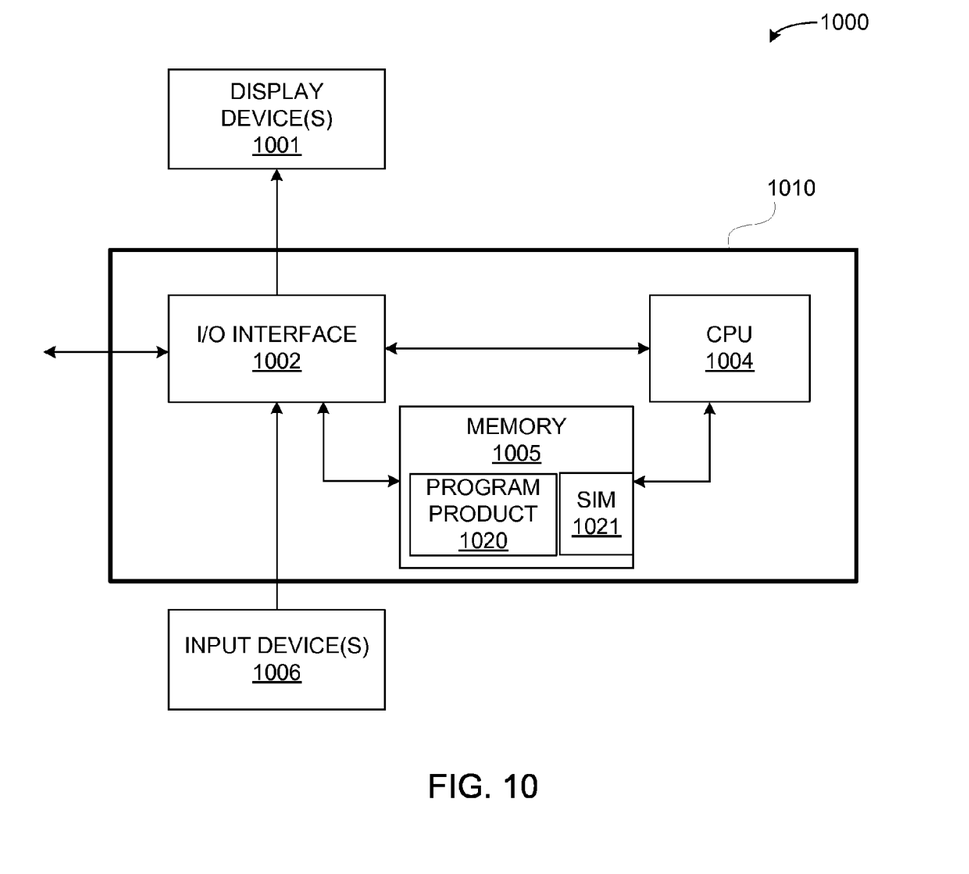
FIG. 10 is a high-level block diagram of an exemplary embodiment of a computer system having a program product in accordance with either or both of the flows of FIGS. 6 and 7.

FIG. 10 is a high-level block diagram of an exemplary embodiment of a computer system 1000. Computer system 1000 may include a programmed computer 1010 coupled to one or more display devices 1001, such as Cathode Ray Tube ("CRT") displays, plasma displays, Liquid Crystal Displays ("LCD"), and to one or more input devices 1006, such as a keyboard and a cursor pointing device. Other known configurations of a computer system may be used.

Programmed computer 1010 may be programmed with a known operating system, which may be Mac OS, Java Virtual Machine, Linux, Solaris, Unix, or a Windows operating system, among other known platforms. Programmed computer 1001 includes a central processing unit (CPU) 1004, memory 1005, and an input/output ("I/O") interface 1002. CPU 1004 may be a type of microprocessor known in the art, such as available from IBM, Intel, and Advanced Micro Devices for example. Support circuits (not shown) may include conventional cache, power supplies, clock circuits, data registers, and the like. Memory 1005 may be directly coupled to CPU 1004 or coupled through I/O interface 1002. At least a portion of an operating system may be disposed in memory 1005. Memory 1005 may include one or more of the following: random access memory, read only memory, magneto-resistive read/write memory, optical read/write memory, cache memory, magnetic read/write memory, and the like, as well as signal-bearing media as described below.

I/O interface 1002 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, I/O interface 1002 may be coupled to a conventional keyboard, network, mouse, display printer, and interface circuitry adapted to receive and transmit data, such as data files and the like. Programmed computer 1010 may be coupled to a number of client computers, server computers, or any combination thereof via a conventional network infrastructure, such as a company's Intranet and/or the Internet, for example, allowing distributed use for interface generation.

Memory 1005 may store all or portions of one or more programs or data to implement processes in accordance with one or more aspects of the invention to provide one or more sub-circuit models ("program product") 1020 for second order effects as described herein. Furthermore, memory 1005 may store a transistor behavior modeling or simulation program 1021, as described herein, for use with such one or more sub-circuit models 1020. Additionally, those skilled in the art will appreciate that one or more aspects of the invention may be implemented in hardware, software, or a combination of hardware and software. Such implementations may include a number of processors independently executing various programs and dedicated hardware or programmable hardware.

One or more program(s) of the program product 1020, as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD). Furthermore, embodiments herein include information downloaded from the Internet and other networks. Such signal-bearing media, when carrying computer-readable instructions that direct functions of one or more aspects of the invention, represent embodiments of the invention.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for simulating behavior of a transistor, comprising:

obtaining at least one sub-circuit model for modeling at least one second order effect associated with the transistor;

obtaining at least one instance parameter for the at least one second order effect;

augmenting operation of a transistor behavior simulator with the at least one sub-circuit model populated with the at least one instance parameter; and simulating, in a computer system, of the behavior of the transistor to produce data taking into account the at least one second order effect;

wherein the at least one second order effect is selected from a combined LOD/eSiGe effect that accounts for an active region of the transistor having a different lattice structure than a substrate associated with the transistor, a poly pitch effect, or a DSL boundary effect.

2. The method according to claim 1, wherein the simulating is a post-layout extracted simulation.

3. The method according to claim 1, wherein the simulating is a schematic level simulation flow.

4. The method according to claim 1, wherein the transistor behavior simulator is a SPICE simulator.

5. The method according to claim 4, wherein the augmenting includes adding the at least one sub-circuit model to a SPICE model.

6. The method according to claim 1, wherein pitches associated with the poly pitch effect are greater than a minimum pitch for a lithography used.

7. The method according to claim 1, wherein the at least one sub-circuit model is for a 45 nm or smaller lithography.

8. The method according to claim 1, wherein the at least one instance parameter is selected from a group consisting of left side stress length (sll1), right side stress length (sll2), upper stress width (slw1), lower stress width (slw2), source side width (wrxs), drain side width (wrxd), source side poly pitch effect (p2ps), and drain side poly pitch effect (p2pd).

9. An apparatus, comprising:
a non-transitory machine-readable medium having stored thereon information representing instructions that, when executed by a processor, cause the processor to perform operations comprising:
obtaining at least one sub-circuit model for modeling at least one second order effect associated with a transistor;
obtaining at least one instance parameter for the at least one second order effect;
augmenting operation of a transistor behavior simulator with the at least one sub-circuit model populated with the at least one instance parameter; and
simulating behavior of the transistor to produce data taking into account the at least one second order effect;
wherein the at least one second order effect is selected from a combined LOD/eSiGe effect that accounts for an active region of the transistor having a different lattice structure than a substrate associated with the transistor, a poly pitch effect, or a DSL boundary effect.

10. The apparatus according to claim 9, wherein the simulating is a post-layout extracted simulation.

11. The apparatus according to claim 9, wherein the simulating is a schematic level simulation flow.

12. The apparatus according to claim 9, wherein the transistor behavior simulator is a SPICE simulator.

13. The apparatus according to claim 12, wherein the augmenting includes adding the at least one sub-circuit model to a SPICE model.

14. The apparatus according to claim 9, wherein pitches associated with the poly pitch effect are greater than a minimum pitch for a lithography used.

15. The apparatus according to claim 14, wherein the at least one sub-circuit model is for a 45 nm or smaller lithography.

16. The apparatus according to claim 9, wherein the at least one instance parameter obtained is selected from a group consisting of left side stress length (sll1), right side stress length (sll2), upper stress width (slw1), lower stress width (slw2), source side width (wrxs), drain side width (wrxd), source side poly pitch effect (p2ps), and drain side poly pitch effect (p2pd).

17. A method for sub-circuit model generation, comprising:
obtaining information from test structures for modeling at least one of the following named second order effects of a group consisting of an LOD/eSiGe effect, a poly pitch effect, and a DSL boundary effect, the test structures including a reference test structure not having any of the named second order effects, and at least one second order effect test structure selected from a group consisting of a test structure having only the poly pitch effect of the named second order effects, a test structure having only the LOD/eSiGe effect of the named second order effects, and a test structure having only the poly pitch effect of the named second order effects, and the information including second order effect instance parameters for transistors associated with the test structures;
converting the information obtained to associations with SPICE model instance parameters of low field effect carrier mobility multiplier (mulu0), saturation velocity multiplier (mulvsat), and change in threshold voltage for a low field (delvto);
the converting including:
obtaining fitting coefficients from fitting equations for fitting the SPICE model instance parameters with the second order effect instance parameters, the fitting equations including:

$mulu0(x)\_effect\_x = f(x,W,L)\_u0$, $mulvsat(x)\_effect\_x = f(x,W,L)\_vsat$, and $delvto(x)\_effect\_x = f(x,W,L)\_vth0$;

wherein the function f(x, W, L) is alternatively expressed as:

$f(x,W,L) = f(W)*f(L)*[A0+A1/x+A2/(x*x)]$, or $f(x,W,L) = f(W)*f(L)*[A0+A1*x+A2*(x*x)]$;

wherein A0, A1, and A2 are the fitting coefficients for at least one second order effect model in the sub-circuit model;
wherein the variable x is a second order effect instance parameter of the second order effect instance parameters selected from drain side width (wrxd), source side width (wrxs), upper stress width (slw1), lower stress width (slw2), left side stress length (sll1), right side stress length (sll2), drain side poly pitch effect (p2pd), and source side poly pitch effect (p2ps); and
wherein the functions f(W) and f(L) are extracted transistor width and transistor length size dependencies, respectively; and
generating the sub-circuit model.

18. The method according to claim 17, wherein the obtaining of the information includes:
measuring electrical parameters for the test structures, the test structures representing various sizes of the transistors;
obtaining data trends in the electrical parameters measured; and
analyzing the data trends and the electrical parameters in relation to the at least one of the named second order effect for the second order effect instance parameters associated with the transistors of various sizes; and
the converting includes analyzing of the trends and the electrical parameters to provide the associations with the SPICE model instance parameters.

19. The method according to claim 17, wherein the converting includes:
simulating the transistors of the various sizes using a SPICE simulator having the SPICE model instance parameters fitted with the second order effect instance parameters; and
comparing the electrical parameters measured with simulation results obtained from the simulating for iteratively adjusting the fitting of the SPICE model instance parameters with the second order effect instance parameters for obtaining of the fitting coefficients A0, A1, and A2 for the at least one second order effect model in the sub-circuit model.

20. The method according to claim 19, wherein the sub-circuit model includes interaction of at least two of the named second order effects.

* * * * *